United States Patent
Dutilleul

[11] Patent Number: 5,841,329
[45] Date of Patent: Nov. 24, 1998

[54] VARIABLE TRAP CIRCUIT

[75] Inventor: Frédéric Dutilleul, Le Neuburg, France

[73] Assignee: U.S. Philips Corporation, New York, N.Y.

[21] Appl. No.: 625,960

[22] Filed: Apr. 1, 1996

[30] Foreign Application Priority Data

Apr. 5, 1995 [FR] France .................. 95 04040

[51] Int. Cl.⁶ .................................................. H03H 7/06
[52] U.S. Cl. ........................................ 333/175; 333/176
[58] Field of Search ........................ 333/174, 175, 333/176

[56] References Cited

U.S. PATENT DOCUMENTS

| | | | |
|---|---|---|---|
| 4,417,220 | 11/1983 | Holyman et al. | 333/174 |
| 4,795,990 | 1/1989 | Ishikawa et al. | 333/176 |
| 5,392,011 | 2/1995 | Li | 333/174 |

FOREIGN PATENT DOCUMENTS

| | | | |
|---|---|---|---|
| 0203343A2 | 12/1986 | European Pat. Off. . | |
| 62-214709 | 9/1987 | Japan | 333/176 |
| 2177709 | 7/1990 | Japan | 333/174 |

Primary Examiner—Robert Pascal
Assistant Examiner—Justin P. Bettendorf
Attorney, Agent, or Firm—Steven R. Biren

[57] ABSTRACT

In a trap circuit of the bridged-T type, having a delta RC circuit (RR, C1, C2) and a parallel resonant circuit (L, Cp), the capacitance Cp is constituted by variable capacitance diodes (D1, D2) connected via a resistor (8) to a control voltage (Vtone), and the resistor (RR) of the bridged-T circuit is constituted by a PIN diode whose current is controlled by the same control voltage (Vtone) via a resistor (9).

10 Claims, 1 Drawing Sheet

VARIABLE TRAP CIRCUIT

BACKGROUND OF THE INVENTION

1. Field of the Invention

The invention relates to a trap circuit having an input terminal, an output terminal, and an intermediate junction point, provided with a variable resistor between the input terminal and the output terminal, a first capacitance between the input terminal and the intermediate junction point, a second capacitance between the intermediate junction point and the output terminal, and an assembly constituted by an inductance in parallel with a capacitance, referred to as parallel capacitance, this assembly being connected between the intermediate junction point and a fixed voltage source.

Such a trap circuit is used in television, particularly in cable distribution installations.

2. Description of the Related Art

Such a trap circuit is known from the prior art described in the document EP-A-0 203 343, corresponding to U.S. Pat. No. 4,795,990, which states that the parallel capacitance must be extremely small if very sharp rejection characteristics are desired, and that the resistance must be very high, which leads to considerable insertion losses. It is recommended to realize the frequency tuning by rendering the inductance variable and by optimizing the attenuation value by means of the resistor.

SUMMARY OF THE INVENTION

It is an object of the invention to obtain a trap circuit having low insertion losses and sharp rejection characteristics, in which, moreover, the rejection frequency is controllable within a frequency range while maintaining its high performance within this range.

This object is achieved in that the parallel capacitance is variable and is constituted by at least one variable capacitance diode, and in that the resistor is constituted by a controlled dynamic resistance element.

The invention is thus based on the idea of bringing about a phase shift by using a capacitance in the parallel assembly whose value is not negligible, and basing the tuning frequency adjustment on this capacitance, while varying the value of this capacitance and the value of the resistor, accordingly.

In a particular embodiment, the parallel capacitance is constituted by two variable capacitance diodes arranged in series in opposite conductivity directions, whose common point is connected to a control voltage source via a resistor or via an inductance.

In a further particular embodiment, while the dynamic resistance of the controlled dynamic resistance element is controlled by the DC current flowing through this element, one end of the controlled dynamic resistance element is connected to a control voltage source via a resistor or via an inductance, and its other end is connected to a fixed voltage source via a resistor or via an inductance.

Advantageously, the control voltage source to which the common point of the two variable capacitance diodes is connected is the same as that to which the controlled dynamic resistance element is connected.

The control of the capacitance and the resistance is thus both simple and efficient.

These and other aspects of the invention will be apparent from and elucidated with reference to the embodiments described hereinafter.

DESCRIPTION OF THE PREFERRED EMBODIMENT

The circuit described hereinafter is intended to provide a trap for a frequency which may be adjusted between approximately 500 MHz and 700 MHz. It will be evident that the invention is also applicable to other frequencies by changing numerical values and constituent component types.

Figure 1:
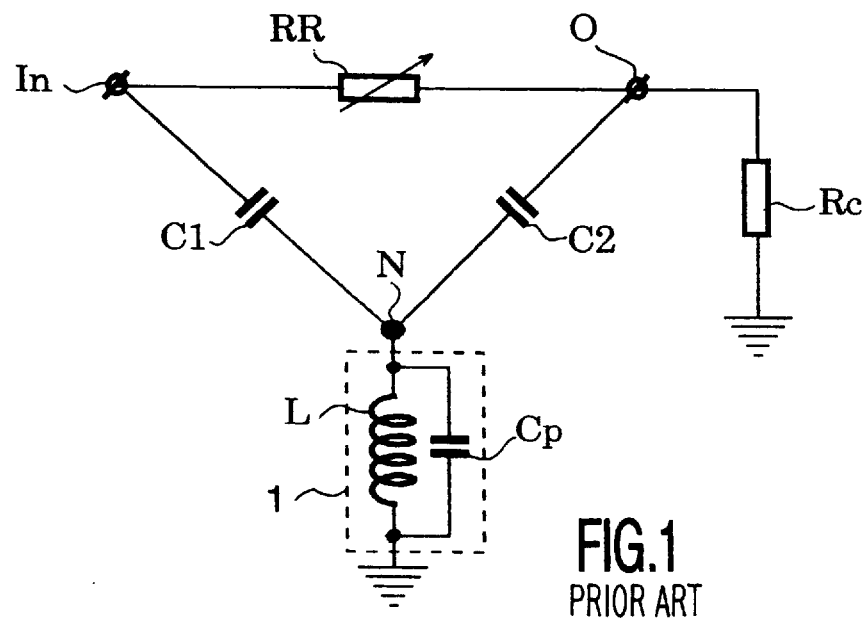
FIG. 1 shows diagrammatically a basic trap circuit.

The circuit of FIG. 1 has an input terminal In, an output terminal O and an intermediate junction point N. It is provided with a variable resistor RR between the input terminal In and the output terminal O, a first capacitance C1 between the input terminal and the intermediate junction point, a second capacitance C2 between the intermediate junction point and the output terminal, and an assembly 1 constituted by an inductance L in parallel with a capacitance Cp, referred to as parallel capacitance, this assembly being connected between the intermediate junction point N and a fixed voltage source, i.e., ground. A load resistor Rc, of 75 Ohms as usual, is connected to the output terminal O.

The basic principle of this circuit is as follows:

- the branch RR-Rc supplies a signal at O in phase with that at the input In,
- at a known frequency, the network C1-L-Cp Shifts in phase slightly more than 90°, the network C2-Rc shifts in phase slightly less than 90° and the assembly C1-L-C2-Rc supplies a signal which is shifted 180° in phase at 0, i.e., in phase opposition with that supplied by RR-Rc,
- if the ratio RR/Rc is well chosen, the two signals which are in phase opposition are equal in absolute value and cancel each other.

The same reasoning may apply in the absence of Cp, but the phase variation around the point of rejection is more rapid in the presence of Cp and the impedance of the assembly 1 is higher than that of the L alone, so that the rejection is sharper and low resistances may be suitable for RR. The insertion losses are low.

The Parallel capacitance Cp is controllable, as well as the dynamic resistance of the resistor RR. It is outstanding that the frequency can be adjusted within a range of at least 40% while maintaining the performance by influencing RR and Cp only.

Figure 2:
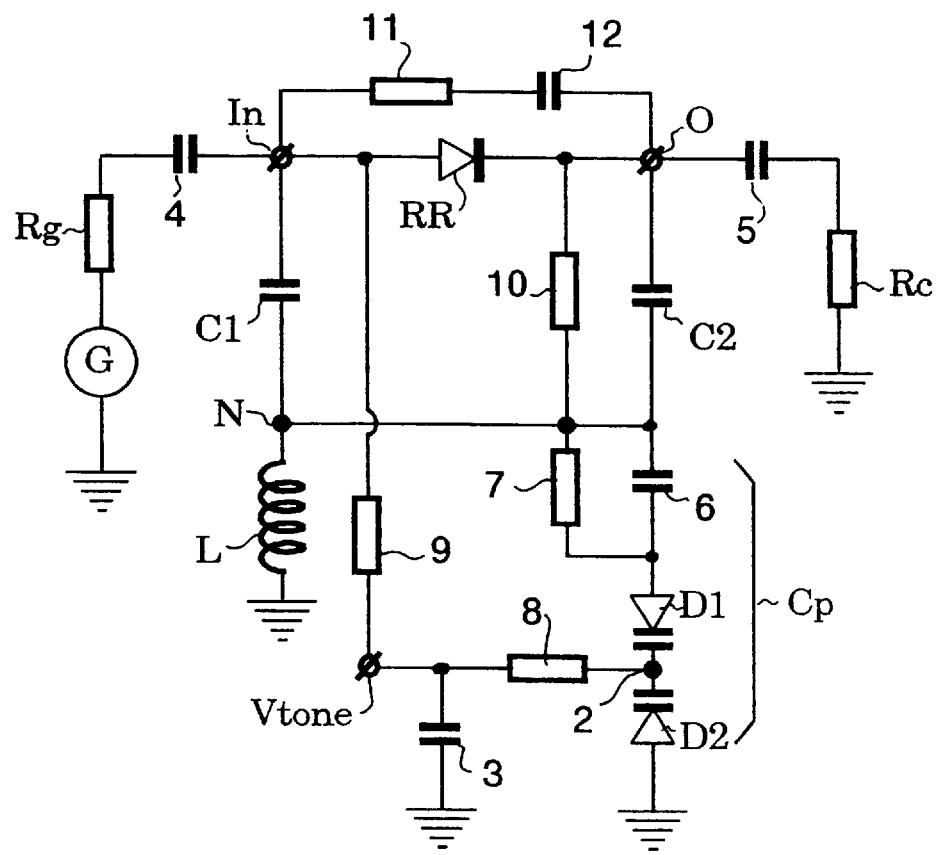
FIG. 2 shows a complete embodiment of a trap circuit according to the invention.

Similarly as the circuit of FIG. 1, the circuit of FIG. 2 has the input terminal In, the output terminal O, and the intermediate junction point N, the variable resistor RR, the capacitance C1, the capacitance C2, the assembly constituted by the inductance L in parallel with the capacitance Cp and the load resistor Rc. An input voltage generator G with an internal resistor Rg is connected to the input In. A DC isolation capacitor 4 is inserted in the path of the input signal applied to the input terminal In. A DC isolation capacitor 5 is inserted in the path of the output signal taken from the output terminal O.

The capacitance CP is constituted by two variable capacitance diodes, referred to as "varicap" diodes D1 and D2, arranged in series in opposite conductivity directions, all this in series with a fixed capacitor 6. The common point 2 of the varicap diodes is connected to control voltage terminal Vtone via a resistor 8. The resistor 33 kOhms may be replaced by an inductance, which is, however, more expensive. A single diode may be used, but this may slightly complicate the polarization circuit of this diode. A decoupling capacitor 3 of 1 nF is connected between the terminal Vtone and ground.

The capacitor 6 allows modification of the variation fiction of the capacitance Cp with the control voltage. To maintain a DC connection which is necessary for the polarization of the diode D1, a resistor 7 is arranged in parallel with the capacitor 6.

The variable resistor RR is constituted by a PIN diode which has the property of a variable dynamic resistance when the DC current flowing through it is varied. A current is produced in this diode by a resistor 9, which may also be replaced by an inductance connected between Vtone and the terminal In, which current loops back to ground via another resistor 10 arranged in parallel with C2 and via the inductance L. It will be understood that the rectangular blocks 8 and 9 in FIG. 2 may be resistors or inductances. The terminal O may alternatively be connected directly, i.e., without the capacitor 5 to the load resistor Rc of 75 Ohms, in which case, the current loops back through Rc; the value of the resistor 9 must then be adjusted, accordingly; the capacitor 4 may also be omitted, provided that the DC output voltage and the output resistance of the generator G are taken into account.

For modifying the form of the variation function of the variable resistor RR with the control voltage, an assembly, constituted by a resistor 11 in series with an isolating capacitor 12, is arranged in parallel with the variable resistor RR.

To constitute the variable resistor RR, a MOS transistor, arranged as a variable resistor, may alternatively be used; this would involve considerable changes in the control polarization of the value of the resistor RR, which is, however, known to those skilled, in the art.

In one embodiment yielding good results, the model BB134 from "Philips Components" is used for each of the diodes D1 and D2, and the model HSMP-3800 from "Hewlett Packard" is used for the PIN diode; the resistors 7 and 8 have a value of 33 kOhms each; the capacitances C1 and C2 have a value of 0.68 pF each; the inductance consists of one and a half wire turns on a mandril having a diameter of 3 mm; the resistor 11 has a value of 240 Ohms, and the capacitors 3, 4, 5 and 12 have a value of 1 nF each; the capacitor 6 has a value of 8.2 pF; the resistors 9 and 10 have a value of 4.7 kOhms each.

I claim:

1. A trap circuit having an input terminal, an output terminal and an intermediate junction point, provided with a variable resistor between the input terminal and the output terminal, a first capacitance between the input terminal and the intermediate junction point, a second capacitance between the intermediate junction point and the output terminal, and an assembly constituted by an inductance in parallel with a capacitance referred to as parallel capacitance, which assembly is connected between the intermediate junction point and a fixed voltage source, characterized in that the parallel capacitance is variable and is constituted by at least one variable capacitance diode, in that the resistor is constituted by a controlled dynamic resistance element, in that a fixed resistor is connected in parallel with the controlled dynamic resistance element, and in that a capacitor is connected in series with the fixed resistor.

2. A trap circuit as claimed in claim 1, characterized in that the parallel capacitance is constituted by two variable capacitance diodes arranged in series in opposite conductivity directions, whose common point is connected to a control voltage source via a resistor or via an inductance.

3. A trap circuit as claimed in claim 1, characterized in that the controlled dynamic resistance element is a PIN diode.

4. A trap circuit as claimed in claim 1, characterized in that the dynamic resistance of the controlled dynamic resistance element is controlled by the DC current flowing through said element, one end of the controlled dynamic resistance element is connected to a control voltage source via a resistor or via an inductance, and its other end is connected to a fixed voltage source via a resistor or via an inductance.

5. A trap circuit as claimed in claim 4, characterized in that the parallel capacitance is constituted by two variable capacitance diodes arranged in series in opposite conductivity directions, whose common point is connected via a resistor or via an inductance to the same control voltage source as the controlled dynamic resistance element.

6. A trap circuit having an input terminal, an output terminal and an intermediate junction point, provided with a variable resistor between the input terminal and the output terminal, a first capacitance between the input terminal and the intermediate junction point, a second capacitance between the intermediate junction point and the output terminal, and an assembly constituted by an inductance in parallel with a capacitance referred to as parallel capacitance, which assembly is connected between the intermediate junction point and a fixed voltage source, characterized in that the parallel capacitance is variable and is constituted by at least one variable capacitance diode, in that the resistor is constituted by a controlled dynamic resistance element, and in that a fixed capacitor shunted by a resistor is arranged in series with the parallel capacitance.

7. A trap circuit as claimed in claim 6, characterized in that the parallel capacitance is constituted by two variable capacitance diodes arranged in series in opposite conductivity directions, whose common point is connected to a control voltage source via a resistor or via an inductance.

8. A trap circuit as claimed in claim 6, characterized in that the controlled dynamic resistance element is a PIN diode.

9. A trap circuit as claimed in claim 6, characterized in that the dynamic resistance of the controlled dynamic resistance element is controlled by the DC current flowing through said element, one end of the controlled dynamic resistance element is connected to a control voltage source via a resistor or via an inductance, and its other end is connected to a fixed voltage source via a resistor or via an inductance.

10. A trap circuit as claimed in claim 9, characterized in that the parallel capacitance is constituted by two variable capacitance diodes arranged in series in opposite conductivity directions, whose common point is connected via a resistor or via an inductance to the same control voltage source as the controlled dynamic resistance element.

* * * * *